United States Patent
Lin

(10) Patent No.: US 9,362,134 B2
(45) Date of Patent: *Jun. 7, 2016

(54) CHIP PACKAGE AND FABRICATION METHOD THEREOF

(71) Applicant: XINTEC INC., Jhongli, Taoyuan County (TW)

(72) Inventor: Chia-Sheng Lin, Zhongli (TW)

(73) Assignee: XINTEC INC., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/465,015

(22) Filed: Aug. 21, 2014

(65) Prior Publication Data

US 2015/0041995 A1    Feb. 12, 2015

Related U.S. Application Data

(63) Continuation-in-part of application No. 13/369,085, filed on Feb. 8, 2012, now Pat. No. 8,901,701.

(60) Provisional application No. 61/441,507, filed on Feb. 10, 2011, provisional application No. 61/868,312, filed on Aug. 21, 2013.

(51) Int. Cl.
*H01L 21/00* (2006.01)
*H01L 21/311* (2006.01)
(Continued)

(52) U.S. Cl.
CPC .... *H01L 21/31111* (2013.01); *H01L 21/02271* (2013.01); *H01L 21/76898* (2013.01); *H01L 23/3114* (2013.01); *H01L 23/481* (2013.01); *H01L 23/525* (2013.01); *H01L 24/05* (2013.01); *H01L 27/14618* (2013.01); *H01L 27/14627* (2013.01); *H01L 27/14685* (2013.01); *H01L 31/02005* (2013.01); *H01L 31/02327* (2013.01); *H01L 31/1876* (2013.01); *H01L 24/03* (2013.01); *H01L 24/13* (2013.01); *H01L 27/14623* (2013.01); *H01L 33/58* (2013.01); *H01L 33/62* (2013.01); *H01L 2224/0231* (2013.01); *H01L 2224/02372* (2013.01); *H01L 2224/02377* (2013.01); *H01L 2224/0401* (2013.01); *H01L 2224/05022* (2013.01); *H01L 2224/05548* (2013.01); *H01L 2224/05567* (2013.01); *H01L 2224/13022* (2013.01);
(Continued)

(58) Field of Classification Search
CPC . H01L 23/3114; H01L 23/481; H01L 23/525; H01L 27/14618; H01L 27/14685
See application file for complete search history.

(56) References Cited

U.S. PATENT DOCUMENTS 7,667,335 B2 *  2/2010  Lin ................... H01L 24/10
                                              257/779
8,084,854 B2 * 12/2011  Pratt ............... H01L 21/76898
                                              257/621

(Continued)

*Primary Examiner* — Nicholas Tobergte
(74) *Attorney, Agent, or Firm* — Liu & Liu

(57) ABSTRACT

A fabrication method of a chip package includes the following steps. A wafer structure having a wafer and a protection layer is provided. The first opening of the wafer is aligned with and communicated with the second opening of the protection layer. A first insulating layer having a first thickness is formed on a conductive pad exposed from the second opening, and a second insulating layer having a second thickness is formed on a first sidewall of the protection layer surrounding the second opening and a second sidewall of the wafer surrounding the first opening. The first and second insulating layers are etched, such that the first insulating layer is completely removed, and the second thickness of the second insulating layer is reduced.

12 Claims, 18 Drawing Sheets

(51) Int. Cl.

| | |
|---|---|
| *H01L 21/02* | (2006.01) |
| *H01L 21/768* | (2006.01) |
| *H01L 23/31* | (2006.01) |
| *H01L 23/48* | (2006.01) |
| *H01L 23/525* | (2006.01) |
| *H01L 31/02* | (2006.01) |
| *H01L 31/0232* | (2014.01) |
| *H01L 27/146* | (2006.01) |
| *H01L 31/18* | (2006.01) |
| *H01L 23/00* | (2006.01) |
| *H01L 33/58* | (2010.01) |
| *H01L 33/62* | (2010.01) |

(52) U.S. Cl.
CPC ... *H01L2224/13024* (2013.01); *H01L 2224/94* (2013.01); *H01L 2924/0001* (2013.01); *H01L 2924/1461* (2013.01); *H01L 2924/15788* (2013.01); *H01L 2933/0058* (2013.01); *H01L 2933/0066* (2013.01)

(56) References Cited

U.S. PATENT DOCUMENTS

| | | | | |
|---|---|---|---|---|
| 8,901,701 | B2 * | 12/2014 | Lin | H01L 21/76898 257/522 |
| 2008/0185738 | A1 * | 8/2008 | Chung | H01L 23/3114 257/782 |
| 2010/0038778 | A1 * | 2/2010 | Lee | H01L 21/76898 257/737 |

* cited by examiner

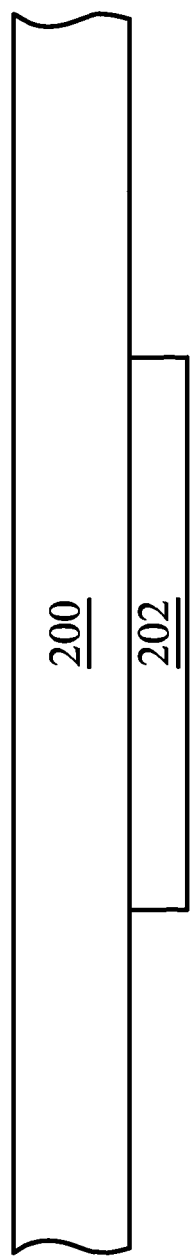

CHIP PACKAGE AND FABRICATION METHOD THEREOF

RELATED APPLICATIONS

This application is a Continuation-In-Part of pending U.S. patent application Ser. No. 13/369,085, filed Feb. 8, 2012, which claims the benefit of U.S. Provisional Application No. 61/441,507, filed Feb. 10, 2011. This application also claims the benefit of U.S. Provisional Application No. 61/868,312, filed Aug. 21, 2013. The entirety of which are incorporated by reference herein.

BACKGROUND

1. Field of Invention

The invention relates to a chip package and more particularly to a chip package with a through substrate via (TSV) structure and a fabrication method thereof.

2. Description of Related Art

As demand for electronic or optoelectronic products, such as digital cameras, camera phones, bar code readers, and monitors, increase, semiconductor technology for products made therefrom must develop rapidly, as product trends demand the semiconductor chip size to be miniaturized and functionality of the semiconductor chip to be increased and become more complex.

Therefore, more than one semiconductor chip is typically placed in a sealed package, due to performance demands, for operational stability. However, since there is mismatch of the coefficient of thermal expansion (CTE) between a passivation layer and a metal redistribution layer (RDL) in a chip package, the metal RDL easily peels off from conductive pads of the semiconductor chip, thus, reducing the reliability of the chip package.

Accordingly, there is a need to develop a novel package structure capable of mitigating or eliminating the above problems.

A conventional semiconductor structure may include a chip, a landing pad, a dielectric layer, e.g. $SiO_2$, and a redistribution layer (RDL). Generally, when the semiconductor structure is manufactured, a wafer before cut into chips is covered by the dielectric layer to protect an electronic element, e.g., a light sensor, on the wafer. Thereafter, a photolithography process and an etching process may be utilized to remove the wafer and the dielectric layer above the landing pad, such that a via is formed in the wafer and the dielectric layer, and the landing pad is exposed through the via.

Subsequently, an insulating layer, by utilizing a chemical vapor deposition method, may cover a surface of the wafer facing away from the dielectric layer, a surface of the wafer surrounding the via, a surface of the dielectric layer surrounding the via, and a surface of the landing pad facing the via. After the insulating layer is formed, a photolithography process and an etching process may be conducted to remove the insulating layer on the surface of the landing pad, such that the landing pad is exposed through the insulating layer. Finally, the redistribution layer is formed on the insulating layer, such that the redistribution layer may be in electrical contact with the landing pad.

A photomask is required in a photolithography process and an etching process for removing the insulating layer on the landing pad. The cost of the manufacturing process and the process time are therefore increased, which make the improvement of the production capacity even more difficult.

SUMMARY

An embodiment of a chip package comprises a semiconductor chip having a first surface and a second surface opposite thereto, at least one conductive pad adjacent to the first surface, and a first opening extending toward the first surface from the second surface to expose the conductive pad. The first opening has a first caliber adjacent to the first surface and a second caliber adjacent to the second surface, and the first caliber is greater than the second caliber. An insulating layer is disposed on the second surface, and extends to a sidewall and a bottom of the first opening, and exposes the conductive pad. A redistribution layer is disposed on the insulating layer and is electrically connected to the exposed conductive pad through the first opening. A passivation layer covers the redistribution layer and partially fills the first opening. The passivation layer has at least one second opening exposing the redistribution layer above the second surface. A conductive bump is disposed in the second opening and is electrically connected to the redistribution layer through the second opening.

A method for fabricating a chip package comprises providing a semiconductor wafer having a first surface and a second surface opposite thereto and having at least one conductive pad adjacent to the first surface and corresponding to each chip region. The semiconductor wafer is etched to form a first opening extending toward the first surface from the second surface in each chip region to expose the conductive pad, wherein the first opening has a first caliber adjacent to the first surface and a second caliber adjacent to the second surface, and the first caliber is greater than the second caliber. An insulating layer is formed on the second surface, and extends to a sidewall and a bottom of each first opening and exposes the conductive pad. A redistribution layer is formed on the insulating layer, wherein the redistribution layer is electrically connected to the exposed conductive pad through each first opening. The redistribution layer is covered and each first opening is partially filled with a passivation layer, wherein the passivation layer has at least one second opening exposing the redistribution layer above the second surface. A conductive bump is formed in the second opening, wherein the conductive bump is electrically connected to the redistribution layer through the second opening. The semiconductor wafer is cut to form a semiconductor chip corresponding to each chip region.

An aspect of the present invention is to provide a fabrication method of a chip package.

According to an embodiment of the present invention, a fabrication method of a chip package includes the following steps. (a) A wafer structure that has a wafer and a protection layer is provided, and a first opening of the wafer is aligned with and communicated with a second opening of the protection layer. (b) A first insulating layer that has a first thickness is formed on a conductive pad that is exposed through the second opening, and a second insulating layer that has a second thickness is formed on a first sidewall of the protection layer that surrounds the second opening and a second sidewall of the wafer that surrounds the first opening. (c) The first and second insulating layers are etched to completely remove the first insulating layer and reduce the second thickness of the second insulating layer.

In the aforementioned embodiments of the present invention, the first insulating layer is formed on the conductive pad that is exposed through the second opening of the protection layer, and the second insulating layer is formed on the first sidewall of the protection layer that surrounds the second opening and the second sidewall of the wafer that surrounds the first opening. Thereafter, since the first thickness of the first insulating layer is smaller than the second thickness of the second insulating layer, the first insulating layer may be completely removed and the second thickness of the second insulating layer is only reduced to be left when the first and second insulating layers are etched.

As a result, a photolithography process and a corresponding etching process do not need to be used to remove the first insulating layer on the surface of the conductive pad, and the first insulating layer may be synchronously removed with the second insulating layer during one etching process, so as to reduce one photomask. Therefore, the cost of the manufacturing process and the process time are reduced, such that the production capacity is improved.

Another aspect of the present invention is to provide a chip package.

According to an embodiment of the present invention, a chip package includes a semiconductor chip, an insulating layer, a redistribution layer, and a passivation layer. The semiconductor chip has a first surface and a second surface that is opposite to the first surface, at least one conductive pad, and a first opening. The conductive pad is adjacent to the first surface, and the first opening extends form the second surface to the first surface to expose the conductive pad. The insulating layer is disposed on the second surface and extends to a sidewall and a bottom portion of the first opening to expose the conductive pad. The insulating layer on the bottom portion of the first opening has a underfoot structure. The redistribution layer is disposed on the insulating layer and electrically connected to the exposed conductive pad through the first opening. The passivation layer covers the redistribution layer and is partially located into the first opening. The passivation layer has at least one second opening to expose the redistribution layer that is on the second surface.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows:

FIGS. 1A to 1I are cross sections of an exemplary embodiment of a method for fabricating a chip package according to the invention;

DETAILED DESCRIPTION

Figure 1B:
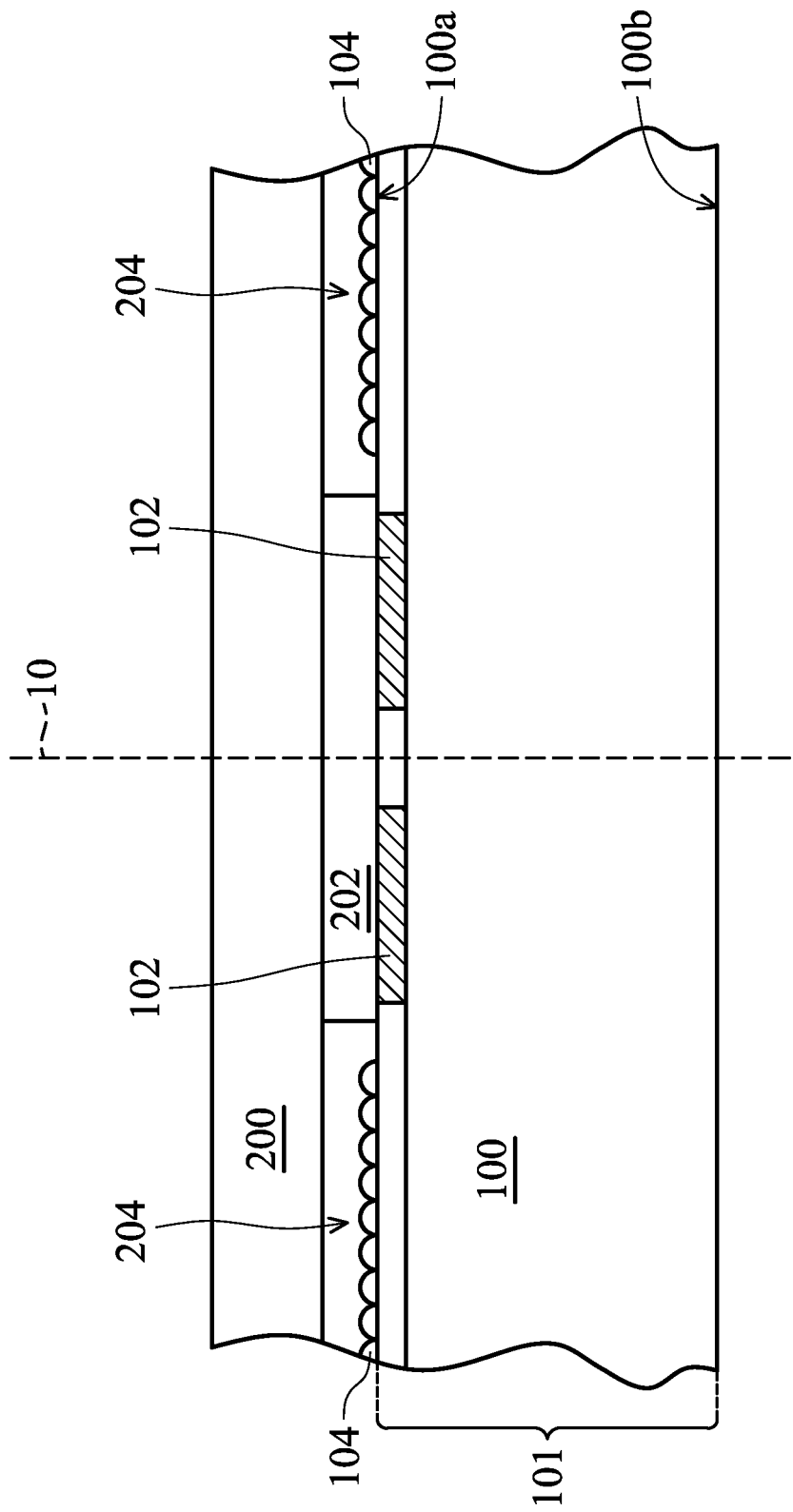

Reference will now be made in detail to the present embodiments of the invention, examples of which are illustrated in the accompanying drawings. Wherever possible, the same reference numbers are used in the drawings and the description to refer to the same or like parts.

Figure 1C:
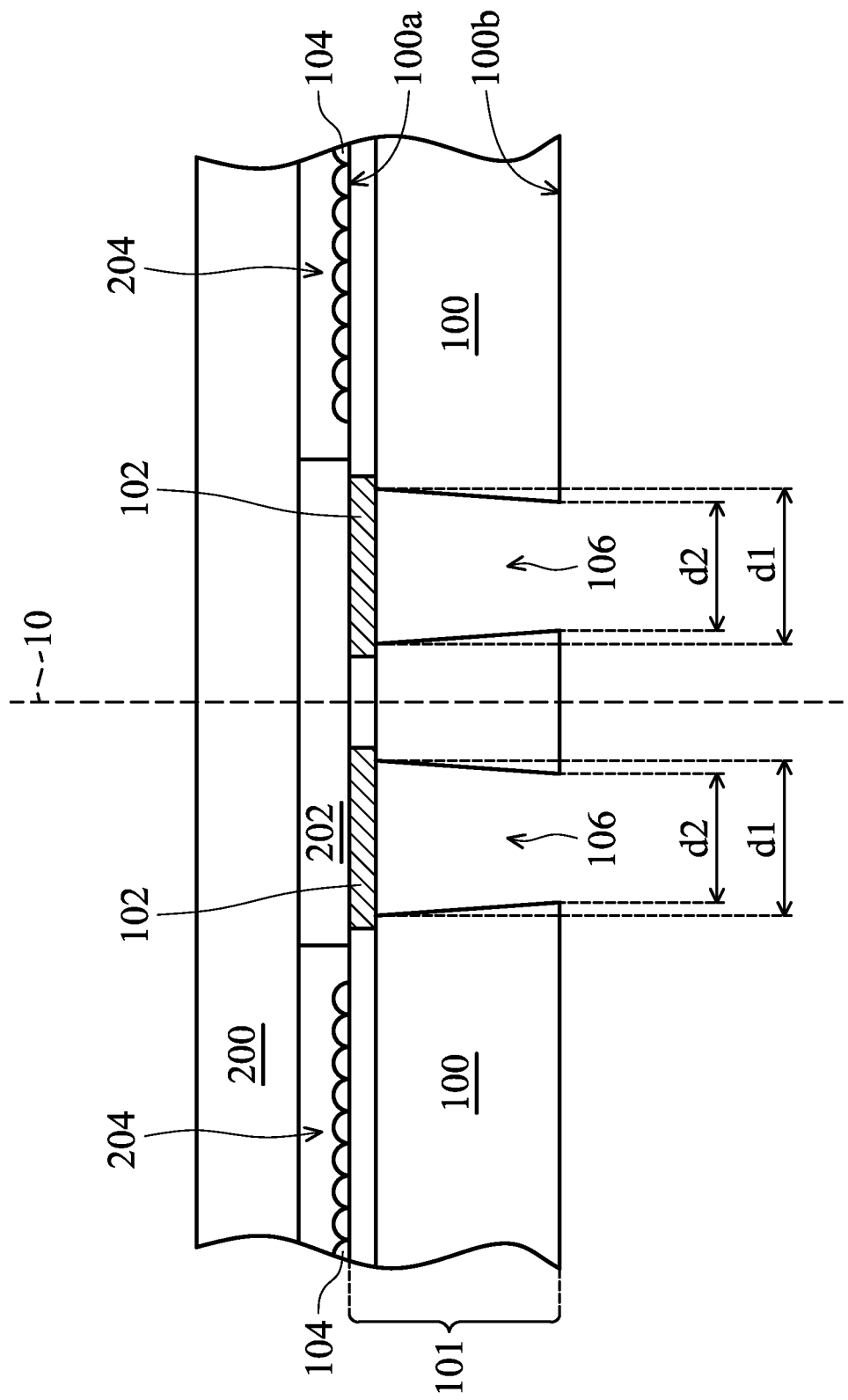
Figure 1D:
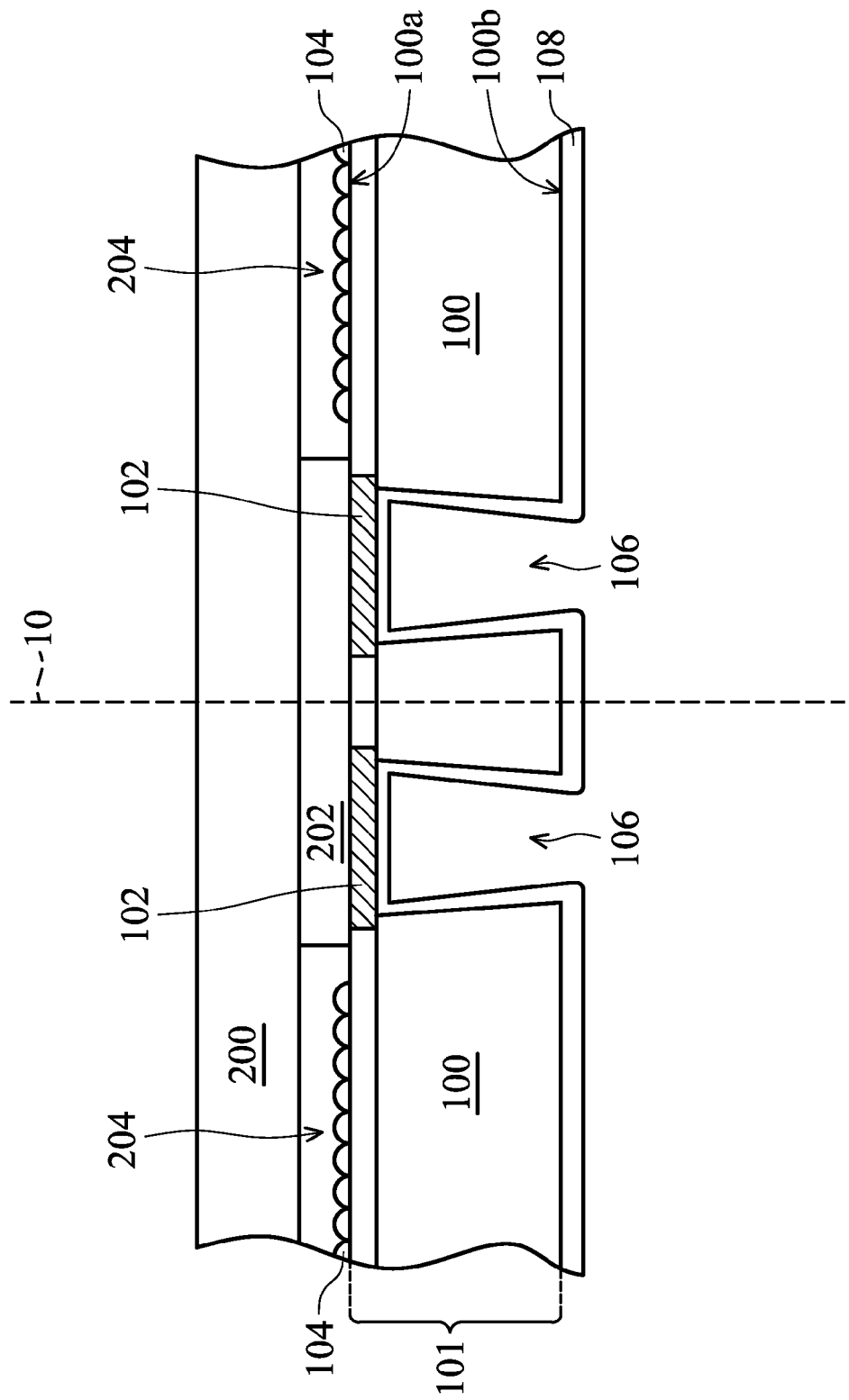
Figure 1E:
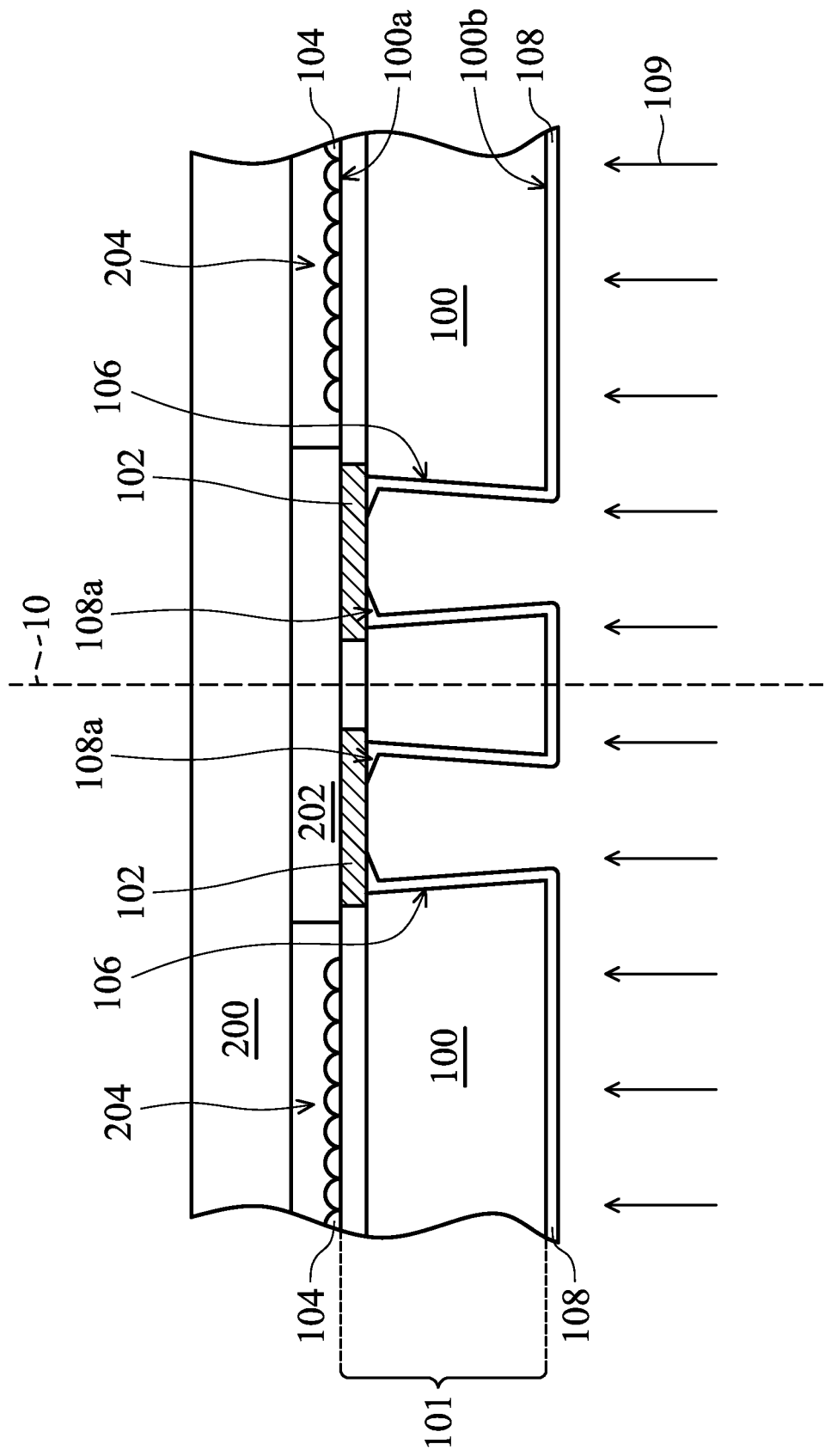
Figure 1F:
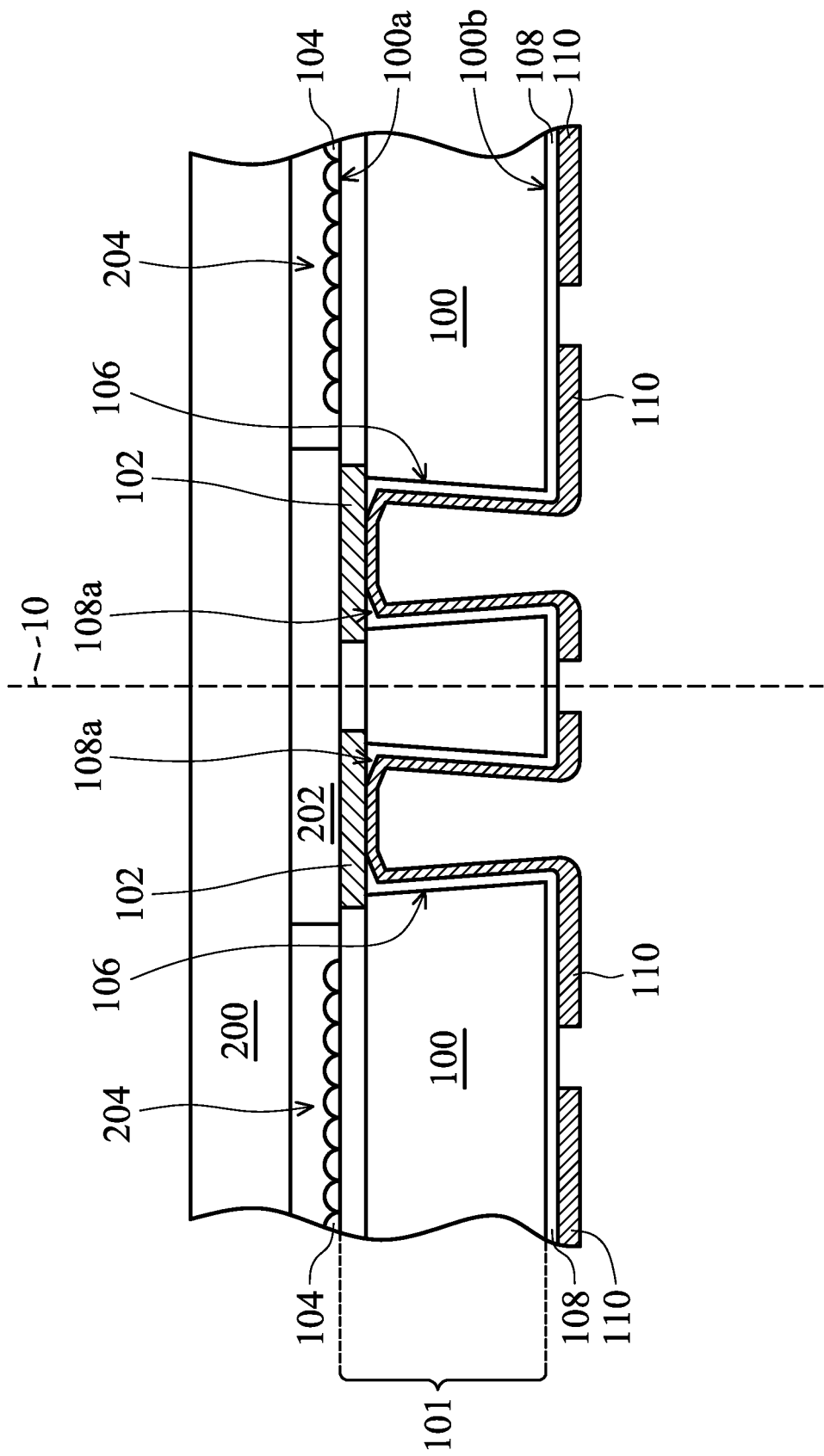
Figure 1G:
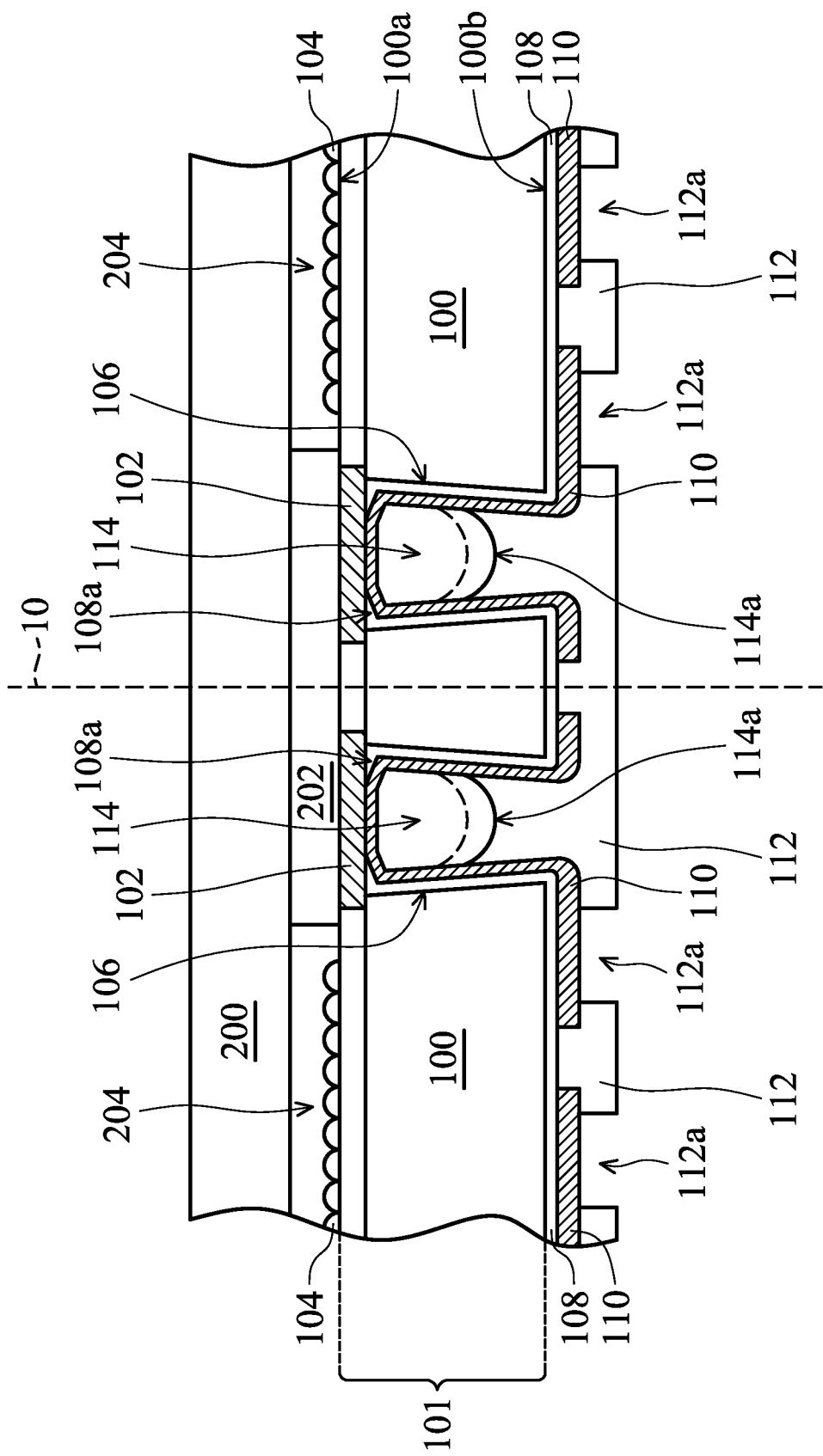
Figure 1H:
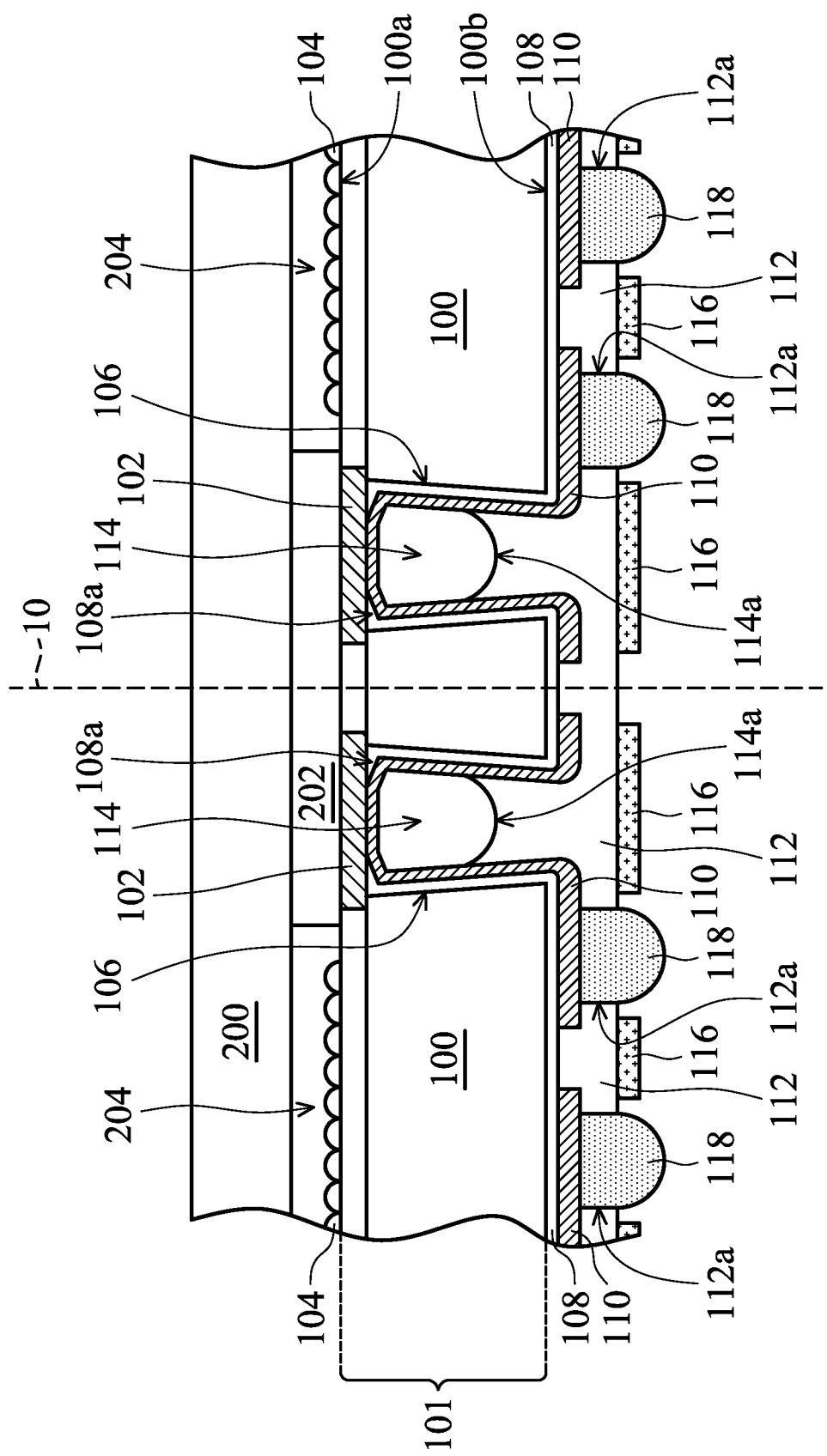
Figure 1I:
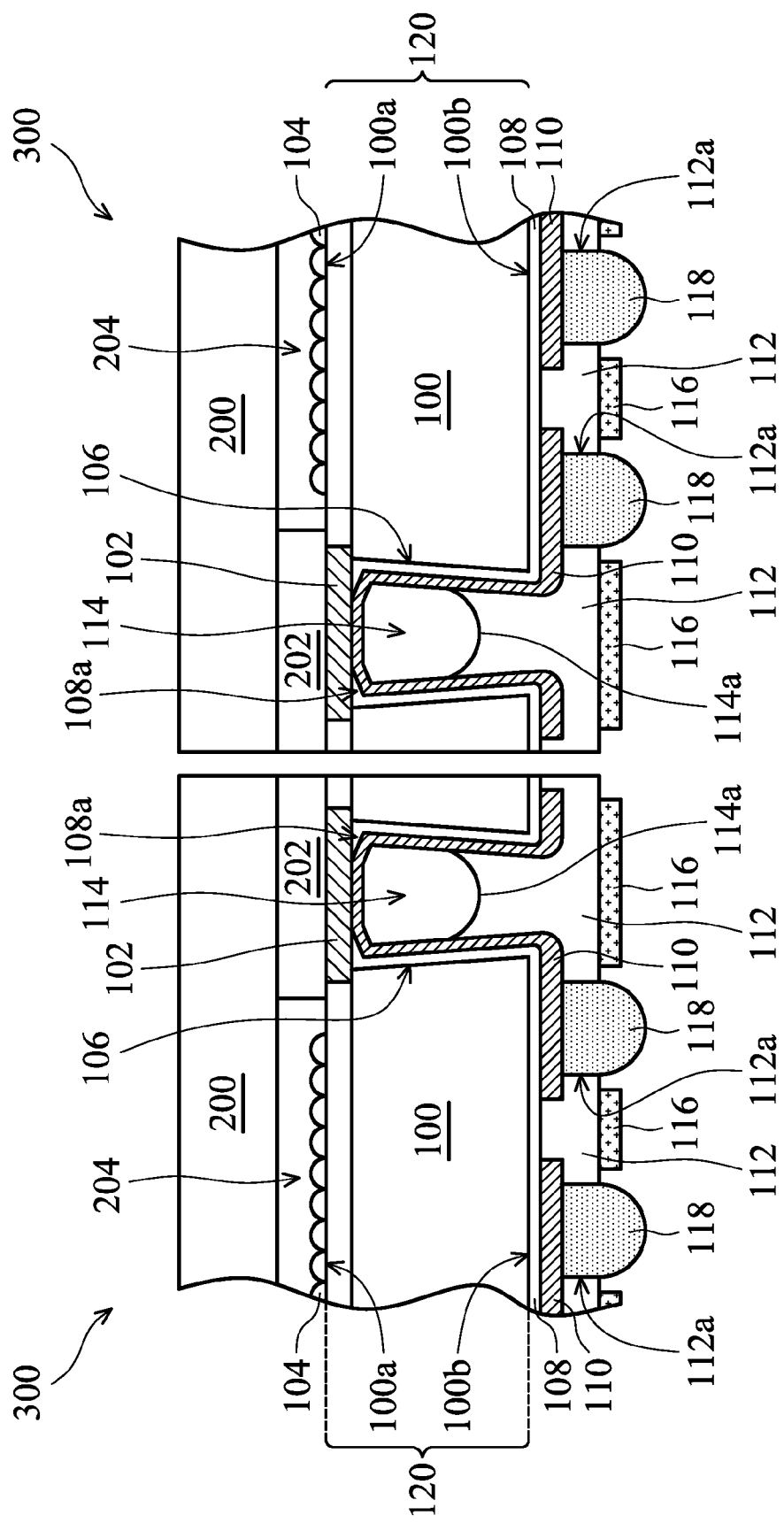

Referring to FIG. 1I, which illustrates a cross section of an exemplary embodiment of a chip package according to the invention. In the embodiment, the chip package may be applied to various electronic components including active or passive elements, digital or analog integrated circuits, such as optoelectronic devices, micro electro mechanical systems (MEMS), micro fluidic systems, and physical sensors for detecting physical characteristics such as detecting heat, light, or pressure. In particular, a wafer level package (WLP) process may be performed to package semiconductor chips which include image sensor devices, light-emitting diodes (LEDs), solar cells, RF circuits, accelerators, gyroscopes, micro actuators, surface acoustic wave devices, pressure sensors, and ink printer heads.

A WLP process involving electronic devices is first packaged at the wafer level and then diced into individual packages. However, in a specific embodiment, separate semiconductor chips may be, for example, redistributed on a carrier wafer for a subsequent packaging process, which may be called a WLP process. In addition, a stacking process may also be used in the WLP process mentioned above to stack a plurality of wafers having integrated circuits to form electronic device packages of multi-layered integrated circuit devices.

The chip package 300 comprises a semiconductor chip 120, an insulating layer 108, a redistribution layer (RDL) 110, a passivation layer 112, at least one bump 118, a microlens array 104, and a glass substrate 200. The semiconductor chip 120 has a first surface 100a and a second surface 100b opposite to the first surface 100a. In the embodiment, the semiconductor chip 120 comprises a substrate 100 and a dielectric layer thereon. The substrate 100, such as a silicon or other semiconductor substrate, may comprise conductive layers, dielectric layers, and other semiconductor elements (e.g., active or passive elements or electronic components for digital or analog integrated circuits). In order to simplify the diagram, only a flat substrate is depicted. Each semiconductor chip 120 has at least one conductive pad 102 adjacent to the first surface 100a and in the dielectric layer on the substrate 100. The conductive pad 102 is electrically connected to the circuits (not shown) in the substrate 100 for providing electrical connections between the semiconductor chip 120 and exterior circuits.

Moreover, the semiconductor chip 120 has an opening 106 (as shown in FIG. 1C) extending toward the first surface 100a from the second surface 100b to expose a corresponding conductive pad 102. In the embodiment, the opening 106 has a first caliber d1 adjacent to the first surface 100a and a second caliber d2 adjacent to the second surface 100b, and the first caliber d1 is greater than the second caliber d2, as shown in FIG. 1C.

The insulating layer 108 is disposed on the second surface 100b of the semiconductor chip 120 and extends to a sidewall and a bottom of the opening 106 to expose the conductive pad 102 on the bottom of the opening 106. In one embodiment, the insulating layer 108 on the bottom of the opening 106 has an underfoot structure 108a, as shown in FIG. 1E.

The RDL 110 is disposed on the insulating layer 108 and extends into the opening 106, such that the RDL 110 is electrically connected to the exposed conductive pad 102 through the opening 106.

The passivation layer 112 covers the RDL 110 and partially fills the opening 106 to form a void 114 between the passivation layer 112 and the conductive pad 102 in the opening 106. However, in another embodiment, the void 114 may not be formed between the passivation layer 112 and the conductive pad 102, and the opening 106 may be full of the passivation layer 112. The present invention is not limited by the void 114. The passivation layer 112 has at least one opening 112a to expose the RDL 110 above the second surface 100b of the semiconductor chip 120. Moreover, the passivation layer 112 may comprise, but is not limited to, a solder mask material, and has a coefficient of viscosity in a range of 7000 cp to 11000 cp. In the embodiment, the void 114 serves as a buffer between the passivation layer 112 and the RDL 110, thereby reducing undesired stress due to the mismatch of the CTE between the passivation layer 112 and the RDL 110. Accordingly, the delamination between the RDL 110 and the conductive pad 102 can be prevented. In one embodiment, the ratio of the height of the void 114 to the depth of the opening 106 is in a range of ½ to ¾. Moreover, the top portion of the void 114 may have a rotational symmetric profile with respect to a central axis of the void 114. For example, the top portion of the void 114 may have an arched profile.

The conductive bump 118 is disposed in a corresponding opening 112a and is electrically connected to the exposed RDL 110 through the opening 112a.

A dam structure 202 is on a surface of the glass substrate 200. The glass substrate 200 is attached to the first surface 100a of the semiconductor chip 120 through the dam structure 202, to form a cavity 204 between the glass substrate 200 and the semiconductor chip 120.

The microlens array 104 is disposed on the first surface 100a of the semiconductor chip 120 and in the cavity 204.

FIGS. 1A to 1I are cross sections of an exemplary embodiment of a method for fabricating a chip package 300 according to the invention. Referring to FIG. 1A, a glass substrate 200 having a dam structure 202 thereon, is provided. Referring to FIG. 1B, a semiconductor wafer 101 having a first surface 100a and a second surface 100b opposite thereto, is provided. A microlens array 104 is formed on the first surface 100a of each chip region defined by scribe lines 10 of the semiconductor wafer 101. Next, the dam structure 202 is attached to the first surface 100a of the semiconductor wafer 101 to form a plurality of cavities 204 between the glass substrate 200 and the semiconductor wafer 101. Each cavity 204 corresponds to a chip region, such that each microlens array 104 is disposed in a corresponding cavity 204.

In the embodiment, the semiconductor wafer 101 may comprise a substrate 100 (e.g., a silicon substrate or other semiconductor substrate) and a dielectric layer thereon. The substrate 100 may comprise conductive layers, dielectric layers, and other semiconductor elements (e.g., active or passive elements or electronic components for digital or analog integrated circuits). In order to simplify the diagram, only a flat substrate is depicted. The semiconductor wafer 101 has a plurality of conductive pads 102 adjacent to the first surface 100a, in the dielectric layer on the substrate 100, and electrically connected to the circuits (not shown) in the substrate 100. The conductive pad 102 may comprise aluminum, copper, gold or a combination thereof or other pad materials well known in the art. Moreover, at least one conductive pad 102 corresponds to each chip region. In order to simplify the diagram, only a conductive pad 102 corresponding to each chip region is depicted.

Referring to FIG. 1C, a wafer thinning process is performed on the second surface 100b of the semiconductor wafer 101 (i.e., the bottom surface of the substrate 100), such that the substrate 100 is thinned to a desired thickness. The wafer thinning process typically comprises etching, milling, grinding or polishing. Thereafter, the second surface 100b of the semiconductor wafer 101 is etched to form an opening 106 extending toward the first surface 100a from the second surface 100b in each chip region, exposing a corresponding conductive pad 102. In the embodiment, the opening 106 has a first caliber d1 adjacent to the first surface 100a and a second caliber d2 adjacent to the second surface 100, wherein the first caliber d1 is greater than the second caliber d2. Accordingly, the sidewall of the opening 106 is tilted with respect to the surface of the substrate 100. The opening 106 may be any shape as viewed from a top view perspective, such as a circular, elliptic, square or rectangular shape. When the opening is circular, the calibers d1 and d2 are the diameters of the opening.

In one embodiment, the formation of the opening 106 may comprise the removal of the substrate 100 by a dry etching process. For example, a main etch is performed firstly. Next, the etching conditions (such as power, pressure, and/or concentrations of the process gases) are changed to perform an over etching process, thereby forming the openings with the first caliber d1 being greater than the second caliber d2.

Referring to FIGS. 1D to 1E, an insulating layer 108 is formed on the second surface 100b of the semiconductor wafer 101, extending to a sidewall and a bottom of each opening 106, and exposing the conductive pad 102. The insulating layer 108 is isolated from a subsequent conductive trace layer and may comprise epoxy resin, solder mask, or other suitable insulating materials, such as silicon oxide, silicon nitride, silicon oxynitride, metal oxide or a combination thereof. The insulating layer 108 may be formed by a coating process (e.g., spin coating, spray coating, or curtain coating) or other suitable deposition, such as liquid phase deposition, physical vapor deposition (PVD), chemical vapor deposition (CVD), low pressure CVD (LPCVD), plasma enhanced CVD (PECVD), rapid thermal CVD or atmospheric pressure CVD (APCVD). Since the sidewall of the opening 106 is tilted with respect to the surface of the substrate 100 and the first caliber d1 is greater than the second caliber d2, the insulating layer 108 on the bottom surface (i.e., the second surface 100b) of the substrate 100 typically has a thickness greater than that of the insulating layer 108 on the sidewall and bottom of the opening 106. Next, Referring to FIG. 1E, a self-aligned etching process 109 is performed on the insulating layer 108, such that the insulating layer 108 on the bottom of the opening 106 forms an underfoot structure 108a and exposes the conductive pad 102 in the opening 106. In one embodiment, the self-aligned etching process 109 may comprise an anisotropic etching process, such as a reactive ion etching (RIE) process.

Next, referring to FIG. 1F, an RDL layer 110 is formed on the insulating layer 108. The RDL 108 extends into each opening 106, such that the RDL 110 is electrically connected to the exposed conductive pad 102 through the opening 106, to form a TSV structure.

Referring to FIG. 1G, the RDL 110 is covered with a passivation layer 112, wherein the passivation layer 112 has a plurality of openings 112a exposing the RDL 110 on the second surface 100b of the semiconductor wafer 101. Each chip region corresponds to at least one opening 112a. In the embodiment, the passivation layer 112 may comprise, but is not limited to a solder mask material, and has a coefficient of viscosity in a range of 7000 cp to 11000 cp. Moreover, since the sidewall of the opening 106 is tilted with respect to the surface of the substrate 100 and the first caliber d1 is greater than the second caliber d2, air remains in the opening 106, such that the passivation layer 112 on the RDL 110 partially fills each opening 106, so as to form a void 114 between the passivation layer 112 and the conductive pad 102 in each opening 106, wherein the passivation layer 112 in the opening 106 does not contact the conductive pad 102.

Next, a baking process is performed to the passivation layer 112 for curing thereof. Since the temperature and pressure of the air in the void 114 are raised, the passivation layer is shrunk and thus the height of the void 114 is increased. In FIG. 1G, the dash line shown in the opening 106 represents the top of the void 114 before performing the baking process. The height of the void 114 must be appropriate. The passivation layer 112 cracks easily when the height of the void 114 is too high, and the void 114 cannot effectively serve as a buffer between the passivation layer 112 and the RDL 110 when the height of the void 114 is too low. In one embodiment, the ratio of the height of the void 114 to the depth of the opening 106 is in a range of ½ to ¾. Moreover, the top portion 114a of the void 114 has a rotational symmetric profile with respect to a central axis of the void 114. For example, the top portion of the void 114 may have an arched profile.

Next, referring to FIG. 1H, a conductive bump 118 is formed in each opening 112a, such that each conductive bump 118 is electrically connected to the RDL 110 through a corresponding opening 112a. Additionally, in one embodiment, a light shielding layer 116, such as black photoresist, may be formed prior to formation of the conductive bump 118 when the chip package is applied to an optoelectronic device, thereby preventing light leakage.

Next, referring to FIG. 1I, the semiconductor wafer 101 is cut along the scribe lines 10 (as shown in FIG. 1H) to form a semiconductor chip 120 corresponding to each chip region. Next, the dam structure 202 and the glass substrate 200 are cut along the scribe lines 10 to form a plurality of individual chip packages 300.

According to the aforementioned embodiments, since the void in the TSV structure can serve as a buffer between the passivation layer and the RDL, the delamination between the RDL and the conductive pad of the semiconductor chip can be prevented, thereby increasing the reliability of the chip package.

Figure 2:
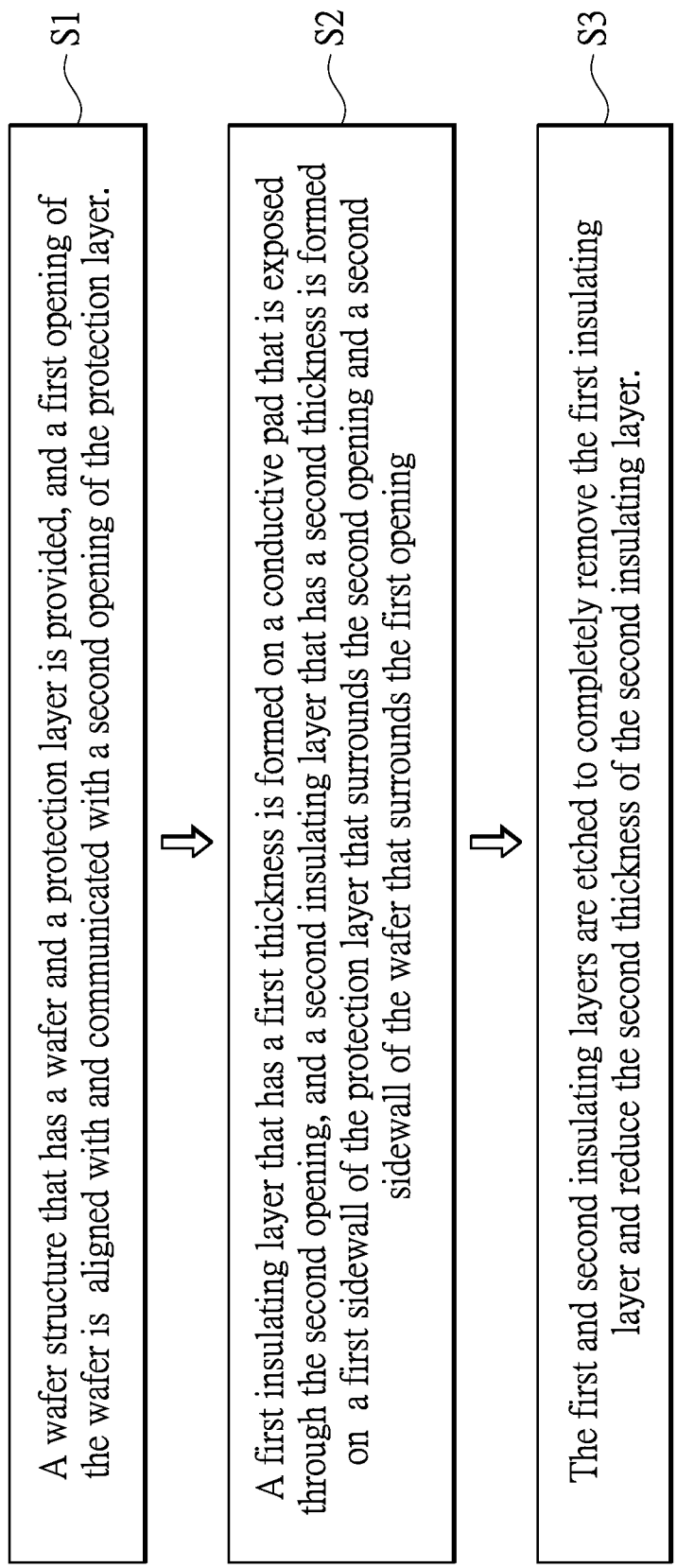
FIG. 2 is a flow chart of a fabrication method of a chip package according to one embodiment of the present invention.

FIG. 2 is a flow chart of a fabrication method of a chip package according to one embodiment of the present invention. In step S1, a wafer structure that has a wafer and a protection layer is provided, and a first opening of the wafer is aligned with and communicated with a second opening of the protection layer. Thereafter in step S2, a first insulating layer that has a first thickness is formed on a conductive pad that is exposed through the second opening, and a second insulating layer that has a second thickness is formed on a first sidewall of the protection layer that surrounds the second opening and a second sidewall of the wafer that surrounds the first opening. Finally in step S3, the first and second insulating layers are etched to completely remove the first insulating layer and reduce the second thickness of the second insulating layer.

In the following description, the aforesaid steps of the fabrication method of the chip package will be described.

Figure 3:
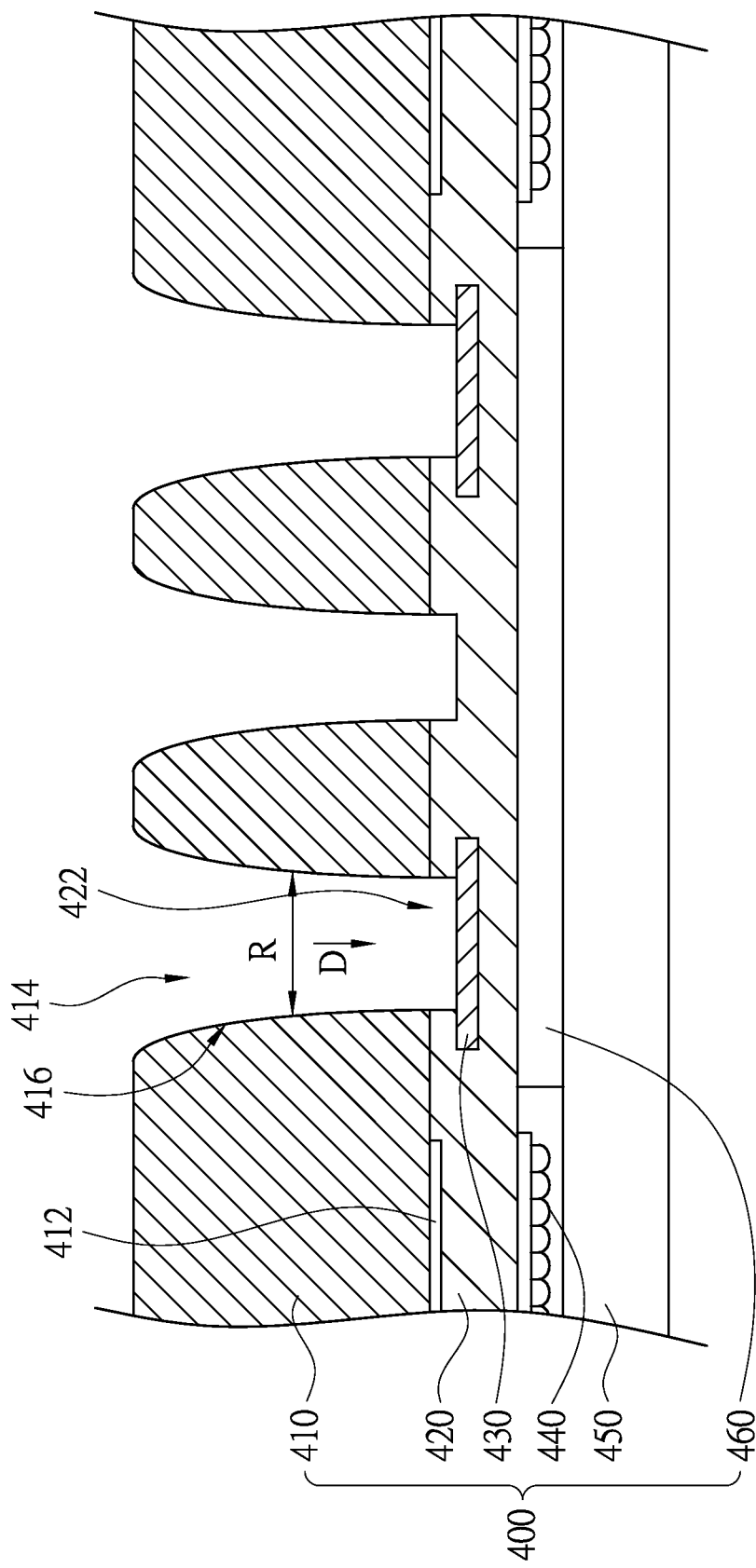
FIG. 3 is a cross-sectional view of a wafer structure shown in FIG. 2.

FIG. 3 is a cross-sectional view of a wafer structure 400 shown in FIG. 2. As shown in FIG. 2 and FIG. 3, the wafer structure 400 may include a wafer 410, a protection layer 420, a conductive pad 430, a color filter 440, a glass substrate 450, and a dam structure 460. The wafer 410 has a light sensor 412 and a first opening 414. The protection layer 420 is located on the surface of the substrate 410 and covers the light sensor 412 to protect the light sensor 412. The protection layer 420 has a second opening 422 and a first sidewall 424 that surrounds the second opening 422, and the second opening 422 is aligned with and communicated with the first opening 414 of the wafer 410. In this embodiment, the caliber R of the first opening 414 is gradually decreased in a direction D toward the second opening 422, but in another embodiment, the caliber R may also be gradually increased in the direction D. Moreover, the second sidewall 416 of the wafer 410 surrounding the first opening 414 is an arc surface.

The conductive pad 430 is located in the protection layer 420 and exposed through the second opening 422. The dam structure 460 is between the glass substrate 450 and the dam structure 460. The color filter 440 is disposed on the surface of the protection layer 420 facing away from the wafer 410. The color filter 440 is aligned with the light sensor 412 of the wafer 410. After a light enters the glass substrate 450, the light may pass through the color filter 440 and be detected by the light sensor 412.

In this embodiment, the wafer 410 may be manufactured to be an image sensor, a microelectromechanical system (MEMS) component, a calculating processor, etc. The wafer 410 may be made of a material that includes silicon. The wafer 410 may form plural chips during a cutting (dicing) process. The protection layer 420 may be, but not limited to silicon oxide, such as $SiO_2$. The conductive pad 430 may be made of a material including aluminum, copper, or other conductive metals. The glass substrate 450 may be a glass plate, and the dam structure 460 may be made of a material including epoxy. However, in another embodiment, the glass substrate 450 and the dam structure 460 may be made of other materials, and the present invention is not limited in this regard.

Figure 4:
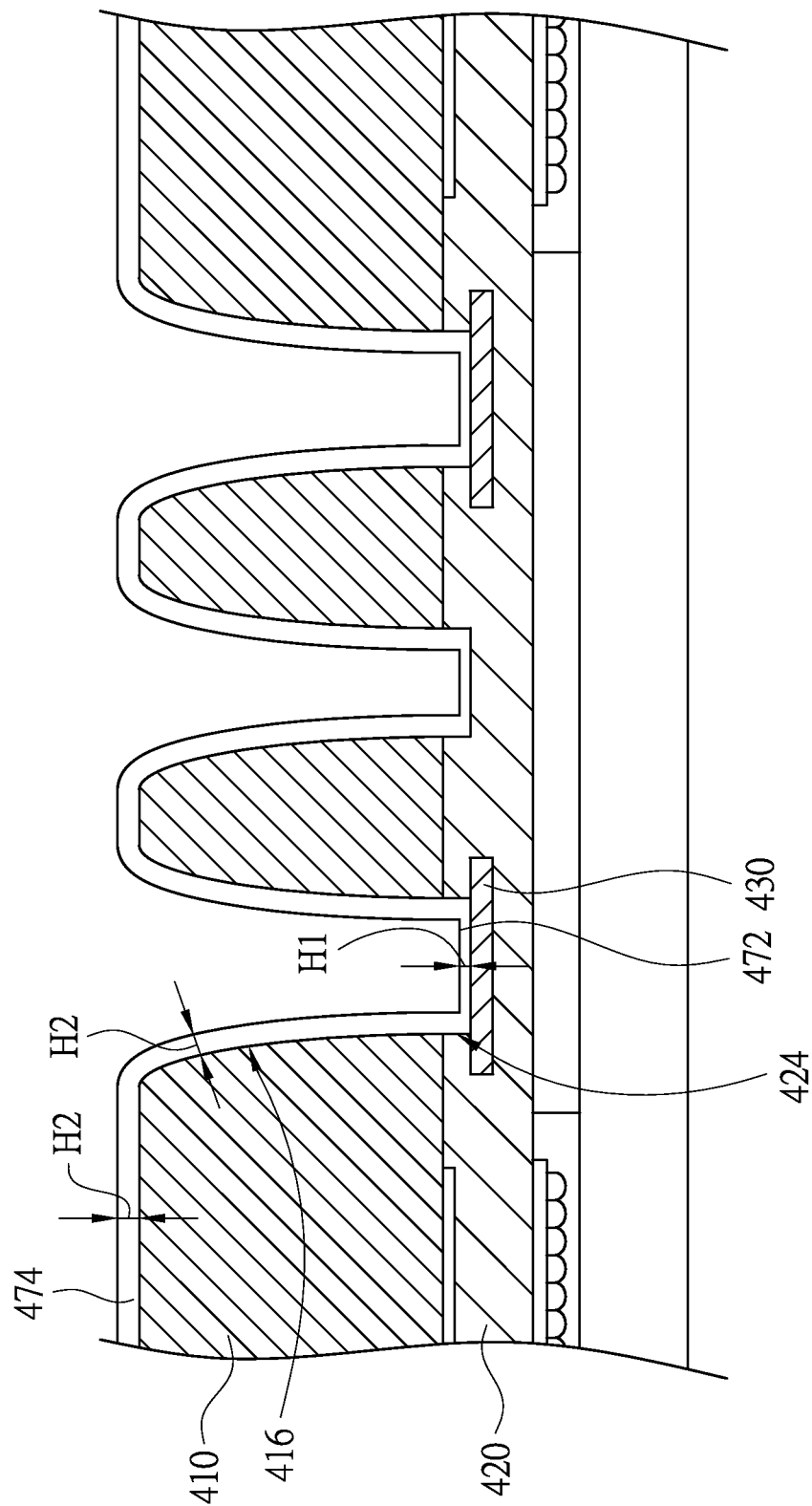
FIG. 4 is a cross-sectional view of a first insulating layer and a second insulating layer after being formed on the wafer structure shown in FIG. 3.

FIG. 4 is a cross-sectional view of a first insulating layer 472 and a second insulating layer 474 after being formed on the wafer structure 400 shown in FIG. 3. As shown in FIG. 3 and FIG. 4, after the wafer structure 400 is provided, the first insulating layer 472 having a first thickness H1 may be formed on the conductive pad 430 that is exposed through the second opening 422, and the second insulating layer 474 having a second thickness H2 may be formed on the surface of the wafer 410 facing away from the protection layer 420, the first sidewall 424 of the protection layer 420 that surrounds the second opening 422, and the second sidewall 416 of the wafer 410 that surrounds the first opening 414.

In this embodiment, each of the first and second insulating layers 472, 474 may be oxide or nitride, and a chemical vapor deposition (CVD) method may perform to form the first and second insulating layers 472, 474, but the present invention is not limited in this regard. Furthermore, the first thickness H1 of the first insulating layer 472 may be in a range from 1.3 to 1.7 µm, and the second thickness H2 of the second insulating layer 474 may be in a range from 2.8 to 3.2 µm, but the present invention is not limited in this regard.

Figure 5:
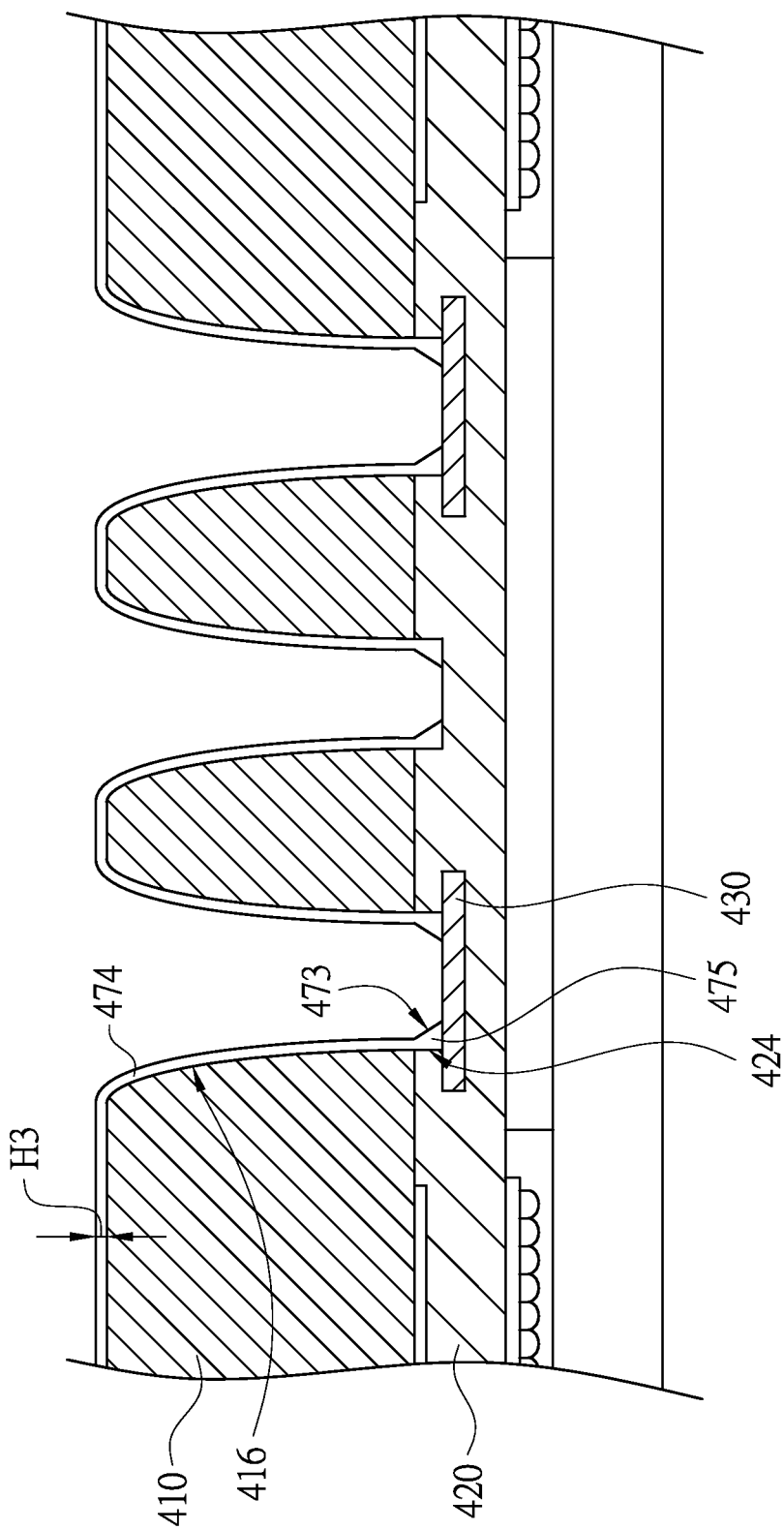
FIG. 5 is a cross-sectional view of a first insulating layer and a second insulating layer shown in FIG. 4 after being etched.

FIG. 5 is a cross-sectional view of the first and second insulating layers 472, 474 shown in FIG. 4 after being etched. As shown in FIG. 4 and FIG. 5, after the first insulating layer 472 with the first thickness H1 and the second insulating layer 474 with the second thickness H2 are formed, the first and second insulating layers 472, 474 may be etched. Since the first thickness H1 of the first insulating layer 472 is smaller than the second thickness H2 of the second insulating layer 474, the first insulating layer 472 may be completely removed and the second thickness H2 of the second insulating layer 474 is only reduced to be left when the first and second insulating layers 472, 474 are etched. For example, after the first insulating layer 472 is completely removed, the second insulating layer 474 still has a third thickness H3. The third thickness H3 may be substantially the difference between the first and second thicknesses H1, H2, but the present invention is not limited in this regard.

As a result, a photolithography process and a corresponding etching process do not need to be used to remove the first insulating layer 472 on the surface of the conductive pad 430, and the first insulating layer 472 may be synchronously removed with the second insulating layer 474 during one etching process, so as to reduce one photomask. Therefore, the cost of the manufacturing process and the process time are reduced, such that the production capacity is improved.

Figure 6:
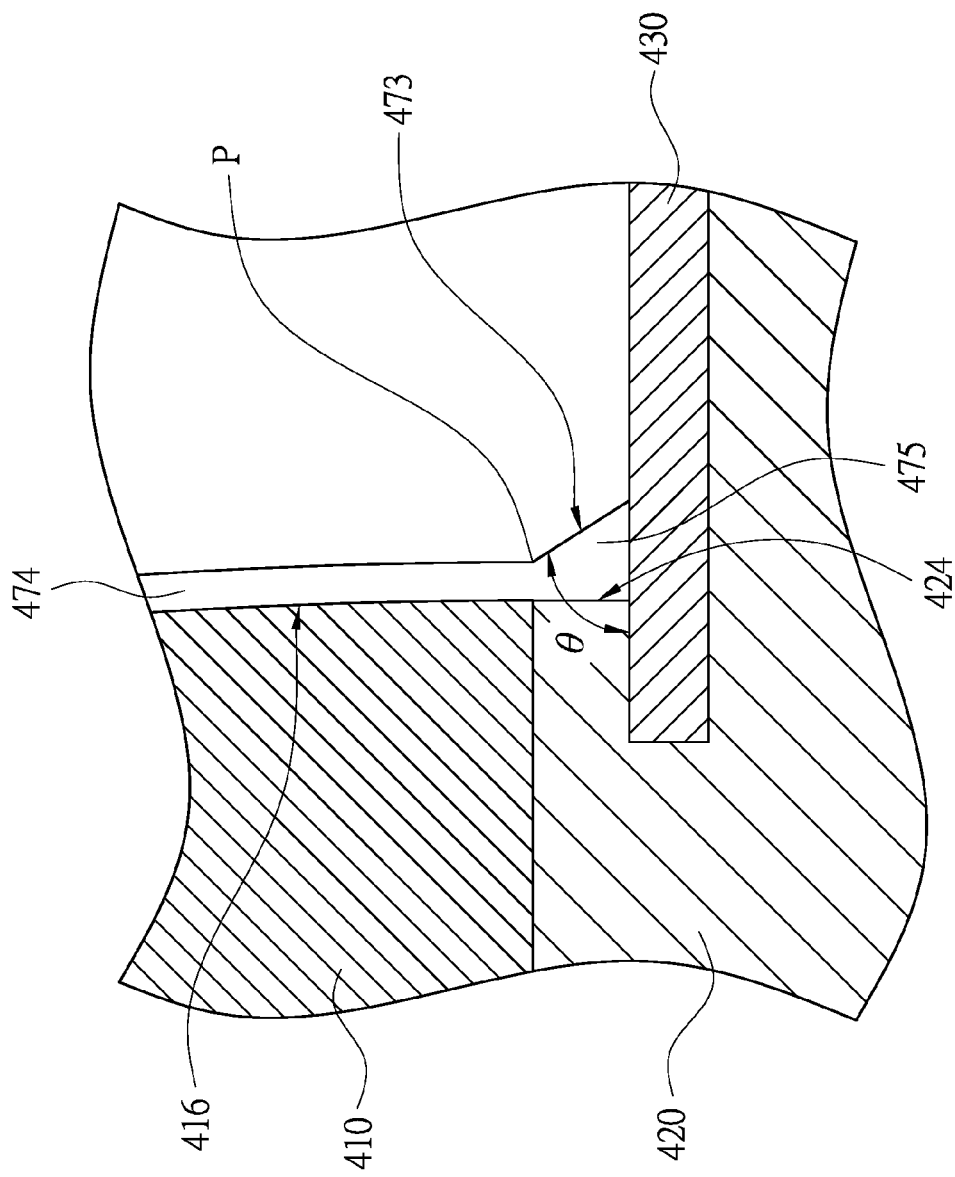
FIG. 6 is a partially enlarged view of a connection position between the second insulating layer and a conductive pad shown in FIG. 5.

FIG. 6 is a partially enlarged view of a connection position between the second insulating layer 474 and the conductive pad 430 shown in FIG. 5. As shown in FIG. 5 and FIG. 6, when the first and second insulating layers 472, 474 are etched, the second insulating layer 474 on the first sidewall 424 may be laterally etched, such that the second insulating layer 474 on the first sidewall 424 has an oblique surface 473. Therefore, an acute angle θ is included between the oblique surface 473 of the second insulating layer 474 and the conductive pad 430, and a underfoot structure 475 is formed, such that a turning position P is formed between the second sidewall 416 and the oblique surface 473.

Figure 7:
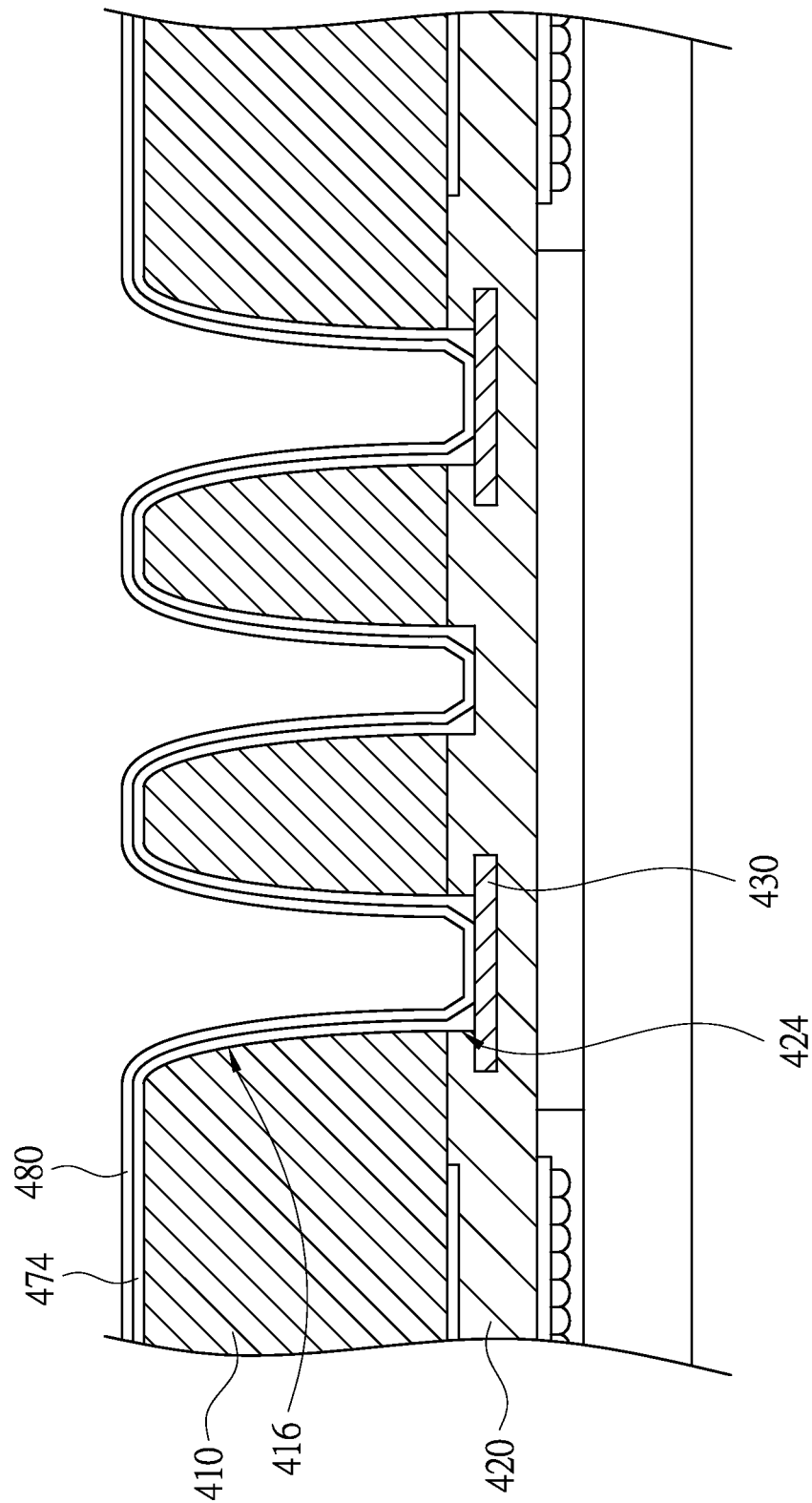
FIG. 7 is a cross-sectional view of a redistribution layer after being formed on the second insulating layer and the conductive pad shown in FIG. 5.

FIG. 7 is a cross-sectional view of a redistribution layer 480 after being formed on the second insulating layer 474 and the conductive pad 430 shown in FIG. 5. As shown in FIG. 6 and FIG. 7, after the first insulating layer 472 (see FIG. 3) is completely removed and the second insulating layer 474 becomes thinner, the redistribution layer 480 may be formed on the second insulating layer 474 and the conductive pad 430, such that the redistribution layer 480 is in electrical contact with the conductive pad 430. Since the laterally etched second insulating layer 474 has the oblique surface 473, the redistribution layer 480 may be prevented from being broken at the connection position between the second insulating layer 474 and the conductive pad 430.

In this embodiment, the redistribution layer 480 may be made of a material including aluminum, copper, or other conductive metals.

Figure 8:
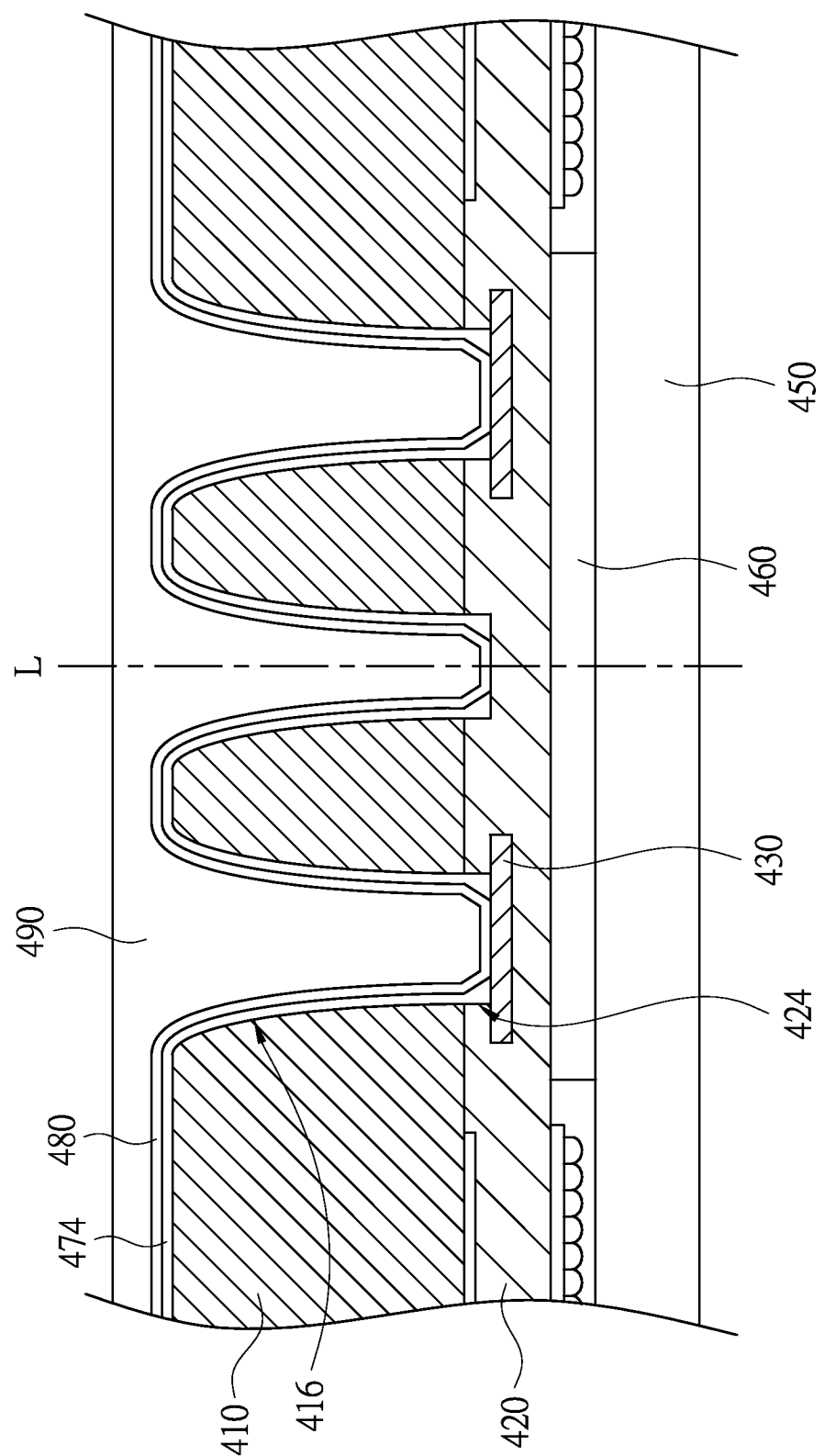
FIG. 8 is a cross-sectional view of the redistribution layer shown in FIG. 7 after being covered by a passivation layer.

FIG. 8 is a cross-sectional view of the redistribution layer 480 shown in FIG. 7 after being covered by a passivation layer 490. As shown in FIG. 7 and FIG. 8, after the redistribution layer 480 is formed on the second insulating layer 474 and the conductive pad 430, the passivation layer 490 may be formed to cover the redistribution layer 480 for protecting the redistribution layer 480, the wafer 410, and the conductive pad 430. In this embodiment, the passivation layer 490 may be, but not limited to silicon oxide, such as $SiO_2$. The passivation layer 490 can insulate vapor and dust.

Figure 9:
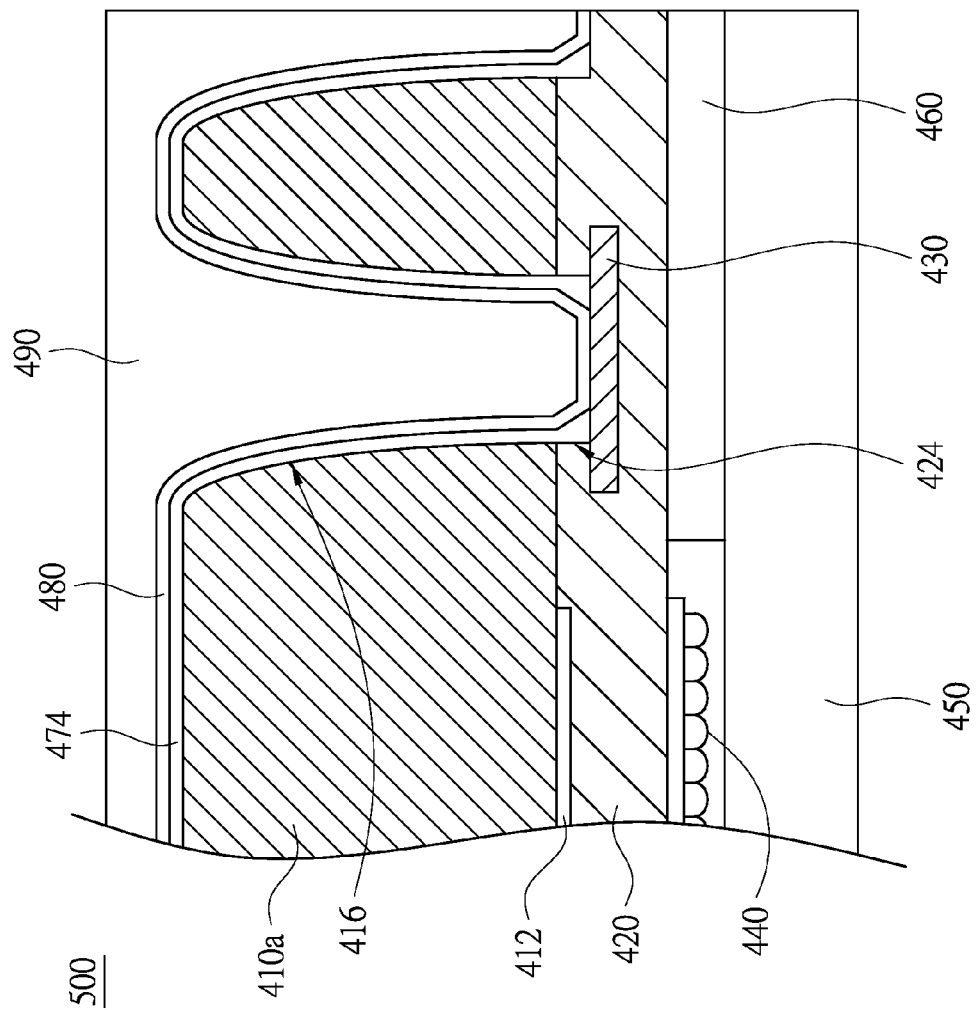
FIG. 9 is a cross-sectional view of a chip package after the passivation layer, a wafer, a protection layer, a dam structure, and a glass substrate shown in FIG. 8 are cut.

FIG. 9 is a cross-sectional view of a chip package 500 after the passivation layer 490, the wafer 410, the protection layer 420, the dam structure 460, and the glass substrate 450 shown in FIG. 8 are cut. As shown in FIG. 8 and FIG. 9, after the passivation layer 490 covers the redistribution layer 480, the passivation layer 490, the wafer 410, the protection layer 420, the dam structure 460, and the glass substrate 450 may be cut (diced) along line L, such that the wafer 410 is diced to form a semiconductor chip 410a. As a result, the chip package 500 shown in FIG. 9 may be obtained.

In this embodiment, there is no void formed between the passivation layer 490 and the conductive pad 430.

Figure 10:
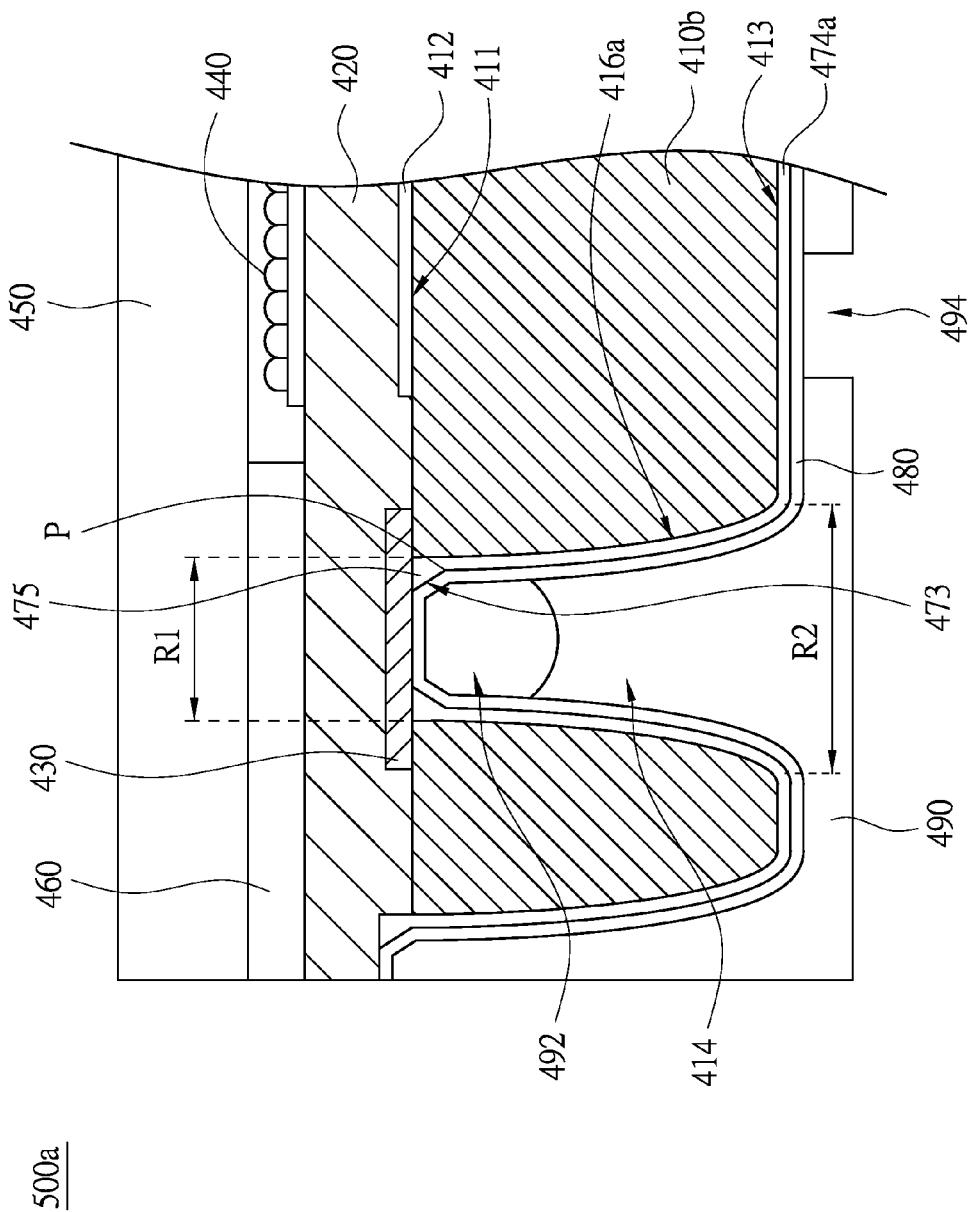
FIG. 10 is a cross-sectional view of a chip package according to one embodiment of the present invention.

FIG. 10 is a cross-sectional view of a chip package 500a according to one embodiment of the present invention. The chip package 500a includes a semiconductor chip 410b, an insulating layer 474a, a redistribution layer 480, and a passivation layer 490a. The semiconductor chip 410b has a first surface 411 and a second surface 413 that is opposite to the first surface 411, at least one conductive pad 430, and a first opening 414. The conductive pad 430 is adjacent to the first surface 411. The first opening 414 extends form the second surface 413 to the first surface 411 to expose the conductive pad 430. The insulating layer 474a is disposed on the second surface 413 and extends to the sidewall 416a and the bottom portion of the first opening 414 (i.e., a position adjacent to the conductive pad 430) to expose the conductive pad 430.

In this embodiment, the insulating layer 474a on the bottom portion of the first opening 414 has a underfoot structure 475. The redistribution layer 480 is disposed on the insulating layer 474a and electrically connected to the exposed conductive pad 430 through the first opening 414. The passivation layer 490a covers the redistribution layer 480 and is partially located into the first opening 414 to form a void 492 between the passivation layer 490a and the conductive pad 430 that are in the first opening 414. The passivation layer 490a has at least one second opening 494 to expose the redistribution layer 480 that is on the second surface 413. In a subsequent process, a conductive structure (e.g., a solder ball) may be formed in the second opening 494 so as to electrically contact the redistribution layer 480.

Moreover, the underfoot structure 475 has an oblique surface 473. A turning position P is formed between the sidewall 416a of the semiconductor chip 410b surrounding the first opening 414 and the oblique surface 473. A thickness from the oblique surface 473 to the first surface 411 is gradually decreased from the turning position P to the center of the conductive pad 430. The first opening 414 has a first caliber R1 and a second caliber R2. The first caliber R1 is adjacent to the first surface 411. The second caliber R2 is adjacent to the second surface 413. The second caliber R2 is greater than the first caliber R1.

The sidewall 416a may be referred to as the second sidewall 416 shown in FIG. 9, and the insulating layer 474a may be referred to as the second insulating layer 474 shown in FIG. 9. The fabrication method of the chip package 500a is similar to that of the chip package 500 shown in FIG. 9, and will not be described again.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package comprising:
  a semiconductor chip having a first surface and a second surface that is opposite to the first surface, at least one conductive pad, and a first opening, wherein the conductive pad is adjacent to the first surface, and the first opening extends from the second surface to the first surface to expose the conductive pad;
  an insulating layer disposed on the second surface and extending to a sidewall and a bottom portion of the first opening to expose the conductive pad, wherein the insulating layer on the bottom portion of the first opening has an underfoot structure;

a redistribution layer disposed on the insulating layer and electrically connected to the exposed conductive pad through the first opening; and a passivation layer covering the redistribution layer and partially located into the first opening, wherein the passivation layer has at least one second opening to expose the redistribution layer on the second surface.

2. The chip package of claim 1, wherein the underfoot structure has an oblique surface.

3. The chip package of claim 2, wherein a turning position is formed between the sidewall of the semiconductor chip surrounding the first opening and the oblique surface.

4. The chip package of claim 3, wherein a thickness from the oblique surface to the first surface is gradually decreased from the turning position to a center of the conductive pad.

5. The chip package of claim 1, wherein the first opening has a first caliber that is adjacent to the first surface and a second caliber that is adjacent to the second surface, and the second caliber is greater than the first caliber.

6. The chip package of claim 1, a void is formed between the passivation layer and the conductive pad in the first opening.

7. A method for fabricating a chip package, comprising:

providing a semiconductor chip having a first surface and a second surface that is opposite to the first surface, at least one conductive pad, and a first opening, wherein the conductive pad is adjacent to the first surface, and the first opening extends from the second surface to the first surface to expose the conductive pad;

disposing an insulating layer on the second surface and extending to a sidewall and a bottom portion of the first opening to expose the conductive pad, wherein the insulating layer on the bottom portion of the first opening has an underfoot structure;

disposing a redistribution layer on the insulating layer and electrically connected to the exposed conductive pad through the first opening; and disposing a passivation layer covering the redistribution layer and partially located into the first opening, wherein the passivation layer has at least one second opening to expose the redistribution layer on the second surface.

8. The method of claim 7, wherein the underfoot structure has an oblique surface.

9. The method of claim 8, further comprising forming a turning position between the sidewall of the semiconductor chip surrounding the first opening and the oblique surface.

10. The method of claim 9, wherein a thickness from the oblique surface to the first surface is gradually decreased from the turning position to a center of the conductive pad.

11. The method of claim 7, wherein the first opening has a first caliber that is adjacent to the first surface and a second caliber that is adjacent to the second surface, and the second caliber is greater than the first caliber.

12. The method of claim 7, further comprising forming a void between the passivation layer and the conductive pad in the first opening.

* * * * *